United States Patent [19]

Skerlos

[11] 3,963,996
[45] June 15, 1976

[54] OSCILLATION SYSTEM FOR INTEGRATED CIRCUIT

[75] Inventor: Peter Constantine Skerlos, Arlington Heights, Ill.

[73] Assignee: Zenith Radio Corporation, Chicago, Ill.

[22] Filed: Sept. 5, 1974

[21] Appl. No.: 503,220

[52] U.S. Cl. .................... 331/117 R; 331/108 D; 332/16 T
[51] Int. Cl.² .......................................... H03B 5/12
[58] Field of Search ............ 331/108 C, 108 D, 117; 332/31 T, 16 T

[56] References Cited
UNITED STATES PATENTS

| | | | |
|---|---|---|---|
| 3,815,051 | 6/1974 | Steckler | 331/117 |
| 3,815,052 | 6/1974 | Watatani et al. | 331/108 D |
| 3,855,553 | 12/1974 | Cronin | 331/117 |
| 3,857,110 | 12/1974 | Grebene | 331/108 D |
| 3,870,971 | 3/1975 | Takahashi | 331/108 D |

Primary Examiner—John Kominski
Attorney, Agent, or Firm—Nicholas A. Camasto; Roy A. Ekstrand

[57] ABSTRACT

An oscillation system includes a pair of differentially connected oscillator transistors having a resonant tank circuit connected between collector electrodes and a current source transistor connecting both emitter electrodes to ground. The collectors and base electrodes of the oscillator transistors are cross connected to provide regenerative feedback and matched resistors connect each collector to a source of operating potential. A shunt transistor is connected to the collector of one of the oscillator transistors and a series transistor connected to their common emitters. The currents of the shunt and series transistors are combined in a second current source transistor. Control signals applied to the base of the series transistor vary the oscillator current (and thereby its frequency), and produce opposite current changes in the shunt transistor, thus maintaining the DC component of the oscillator output signal at a constant.

8 Claims, 3 Drawing Figures

U.S. Patent June 15, 1976 3,963,996
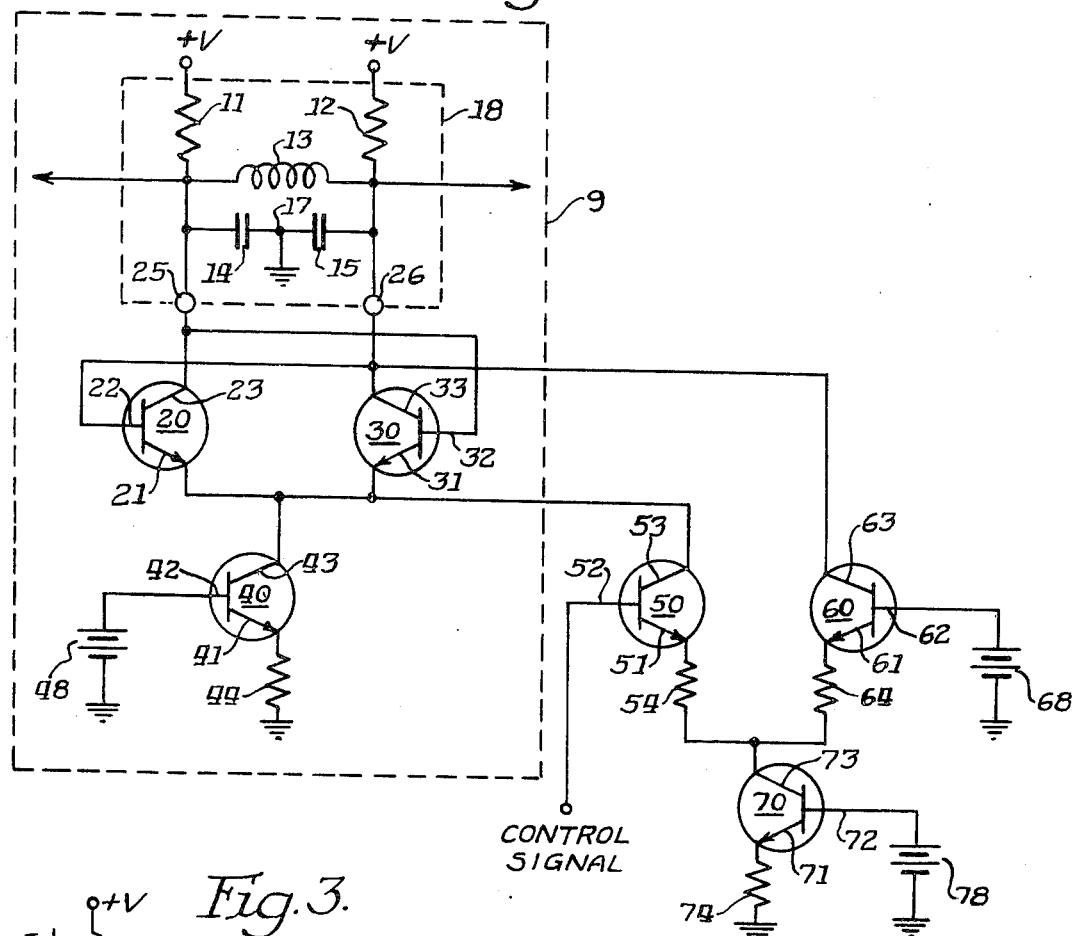
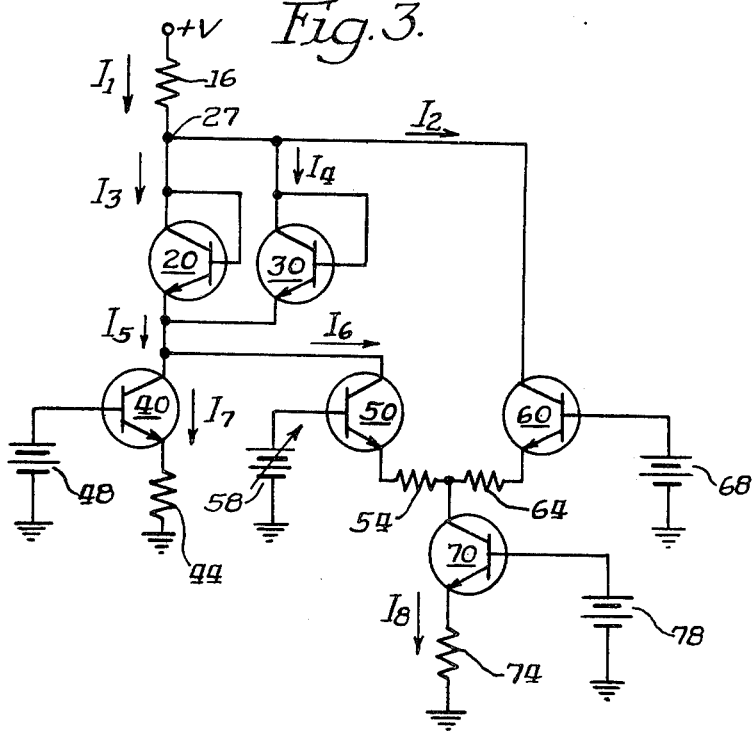
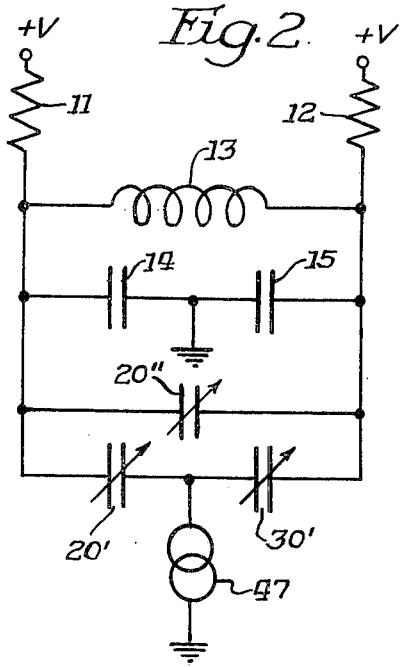

OSCILLATION SYSTEM FOR INTEGRATED CIRCUIT

RELATED APPLICATIONS

This invention is disclosed, but not claimed, in an abandoned application Ser. No. 494,448, filed Aug. 5, 1974, entitled COLOR TELEVISION RECEIVER WITH IMPROVED TUNING CHARACTERISTICS, in the name of Peter C. Skerlos and assigned to Zenith Radio Corporation which is hereby incorporated by reference.

BACKGROUND OF THE INVENTION

This invention relates in general to signal controlled variable frequency oscillators and in particular to those suitable for fabrication in integrated circuit form.

Integrated circuits (IC's) comprise a number of semiconductor devices formed on a single substrate or monolithic "chip". Their use in electronic circuit applications is growing because of their size, economy and reliability, especially in small signal processing circuitry. Large numbers of transistors, resistors and diodes, as well as small capacitors may readily be formed on a chip which is typically 2,000 to 10,000 square mils in area. The chip circuitry has terminals for signal coupling and bringing in operating potentials. Additionally, inductive circuit elements, large capacitors and other external components are connected to selected portions of the chip circuitry through terminals, which are connected to the chip circuitry by conductive paths terminating in bonding pads located near the chip periphery.

The monolithic chip is packaged, or encapsulated within an insulating container and connections are made, generally with gold filament-like leads, between the bonding pads and corresponding terminals. Once encapsulated, the IC package is an insulated, sealed capsule having a number of exposed terminals for making connections between external devices and those within the chip. The number of exposed terminals which can be accommodated is controlled by practical limitations of integrated circuit packaging.

A commonly used integrated circuit package in consumer electronics is the dual-in-line type in which a flat, elongated, molded capsule houses a monolithic chip and supports two parallel rows of terminals along its sides, giving the package a caterpillarlike appearance. The package generally has from 12 to 24 terminals. Configurations with more than 24 terminals have disadvantages, such as difficulty of insertion into mating sockets without terminal damage and much higher probability of defective terminal bonding connections.

IC economics is largely predicated on high volume production, and consequently, there is great emphasis placed on standard packaging. Often, desirable circuit configurations are not implemented for lack of a terminal. Similarly, a large number of devices may be in use and servicing considerations dictate that succeeding devices be compatible and interchangeable.

Since it is difficult to make integrated circuit signal coupling capacitors, the requirement of minimizing external components (and thereby terminals) for efficient large scale integration dictates that wherever possible internal stages be directly coupled within the integrated circuit rather than via external coupling components.

Signal controlled variable frequency oscillators, which are often used in the types of electronic systems sought to be integrated, typically include a resonant circuit, consisting of conventional elements, for establishing the oscillator's natural frequency and a control signal responsive variable resonance network for changing the oscillator frequency. The variable resonance network may include variable reactance elements, such as variable capacity diodes, or variable conduction elements, such as transistors, in conjunction with conventional non-integratable inductive and capacitive elements. Thus, conventional signal controllable oscillators include many nonintegratable elements which are connected to the IC chip by terminals.

The difficulty of fabricating integrated semiconductor devices to external standards is well known. Likewise, the ease of fabricating IC semiconductor devices of similar characteristics on the same chip is also well known. Consequently, the basic building block of integrated circuitry is the differential amplifier (having paired configurations of transistors of like characteristics) and wherever possible it is desirable to process signals in differential or balanced form.

The signal controllable variable frequency oscillator of the invention produces a balanced variable frequency output, for DC coupling to other integrated stages, and is frequency controllable without external resonant circuitry.

OBJECTS OF THE INVENTION

Accordingly, it is an object of the present invention to provide an improved signal controllable variable frequency oscillator.

It is a more particular object to provide a novel integratable signal controllable variable frequency oscillator.

It is a still more particular object to provide an improved signal controllable variable frequency oscillator producing a balanced output signal capable of being DC coupled to other integrated stages.

SUMMARY OF THE INVENTION

A signal controllable variable frequency oscillation system, suitable for fabrication in an integrated circuit, has an oscillator whose frequency varies as a function of its conduction level, means changing the oscillator conduction level in response to an applied control signal, and means maintaining the DC level of the output signals substantially constant despite changes in oscillator conduction level.

BRIEF DESCRIPTION OF THE DRAWINGS

FIG. 1 is a schematic of a signal controllable variable frequency oscillator constructed in accordance with the invention.

FIG. 2 is the AC equivalent circuit diagram of the disclosed signal controllable variable frequency oscillator.

FIG. 3 is the DC equivalent circuit diagram of the disclosed signal controllable variable frequency oscillator.

DETAILED DESCRIPTION OF THE INVENTION

FIG. 1 shows the oscillator system of the present invention and which comprises a portion of the integrated circuit disclosed in the above-mentioned Skerlos application. Dashed line box 9 defines the oscillator portion of the oscillator system. An oscillator transistor 20 has an emitter electrode 21, a base electrode 22 and a collector electrode 23 which is connected to a source of DC potential +V by a resistor 11. An oscillator transistor 30 has an emitter electrode 31 connected to emitter 21 of transistor 20, a base electrode 32 cross connected to collector 23 of transistor 20 and a collector electrode 33 connected to +V by a resistor 12. Collector 33 of transistor 30 is cross connected to base 22 of transistor 20. A current source transistor 40 has an emitter electrode 41 connected to ground through a resistor 44, a base electrode 42 connected to a source of fixed positive potential, represented by a battery 48, and a collector electrode 43 connected to emitters 21 and 31 of transistors 20 and 30. A series combination of capacitors 14 and 15, having their junction 17 connected to ground, is coupled in parallel with a low resistance inductor 13 forming a resonant tank circuit between the collectors of transistors 20 and 30 which together with resistors 11 and 12 provides a load impedance (shown enclosed by dashed line 18) for the oscillator.

The cross connected bases and collectors of transistors 20 and 30 produce the required regenerative feedback to cause oscillation during which current flows alternately through transistors 20 and 30, developing antiphase balanced output signals across resistors 11 and 12, which are matched. The resonant tank circuit, which will also be recognized as including the inherent capacitances of oscillator transistors 20 and 30, provides a filter network for determining the frequency of oscillation. The grounding of junction 17 provides low impedance current paths for undesired harmonic signals at collectors 23 and 33. Because base 42 is maintained at a fixed potential, the current flowing in the collector of transistor 40 is fixed and the transistor acts as a "constant current source" and, therefore, conduction of transistors 20 and 30 has substantially no effect on the current flow in transistor 40.

A series transistor 50 has an emitter electrode 51, a base electrode 52, connected to a source of control signal (not shown), and a collector electrode 53 connected to the junction of the emitters of oscillator transistors 20 and 30 and the collector of current source transistor 40. A shunt transistor 60 has an emitter electrode 61, a base electrode 62 connected to a source of fixed potential, represented by a battery 68, and a collector electrode 63 connected to the collector of oscillator transistor 30. A current source transistor 70 has an emitter electrode 71 connected to ground through a resistor 74, a base electrode 72 connected to a source of fixed potential, represented by a battery 78, and a collector electrode 73 connected to the emitter of series transistor 50 by a resistor 54 and to the emitter of shunt transistor 60 by a resistor 64. The entire circuit shown in FIG. 1, with the exception of inductor 13 and capacitors 14 and 15 within load impedance 18, is fabricated within an integrated circuit. Connections 25 and 26 represent the described externally accessible IC terminals and are used to interconnect the non-integratable components within load impedance 18 to the remainder of the oscillation system. Resistors 11 and 12 are fabricated within the IC for improved DC tracking. It should be noted that these are the only IC terminals which are required because of the oscillation system.

In operation, transistors 50 and 60 provide shunt and series current paths for the oscillator, which paths are combined in transistor 70. Series transistor 50 conduction current flows over the path including resistors 11 and 12, oscillator transistors 20 and 30, and current source transistor 70. Transistor 60 conduction current flows over the path including resistors 11 and 12 and transistor 70, which is in substantially shunting relationship to the oscillator transistors 20 and 30.

Because base 72 is maintained at a fixed potential, transistor 70 forms a constant current source similar to that described above for transistor 40. Transistors 50 and 60 form in effect a differential amplifier in which their respective currents are added in constant current source transistor 70. Since the sum of currents through transistors 50 and 60 are held constant, changes of current in series transistor 50 result in opposite current changes in shunt transistor 60. As a result, the relative conductions of transistors 50 and 60 vary in response to the applied control signal but their sum, flowing through transistor 70, remains constant. It should be noted at this point that a single control signal is applied to base 52 of series transistor 50 while base 62 of shunt transistor 60 is maintained at a constant potential. Obviously, if the control signal is in a differential form, no fixed potential would be applied to base 62. Instead bases 52 and 62 of series transistor 50 and shunt transistor 60 would both be driven by the control signal.

FIG. 2 depicts the AC equivalent of load impedance 18 and variable capacitances 20' and 30' representing the collector-emitter and emitter-base interelectrode capacities associated with oscillator transistors 20 and 30, respectively, and variable capacitance 20'' representing their combined collector-base interelectrode capacities. Current source 47 represents the sum of all currents flowing through the oscillator and may, for analysis, be considered a very high impedance.

Before discussing the AC equivalent circuit further, an understanding of the associated capacities of the oscillator transistors and their variations with current which, in turn, requires some explanation of the transistor physical properties will be helpful. Transistors are formed by placing regions of "N" and "P" type semiconductor material in predetermined patterns. N material may be thought of as a source of electrons and P material as a source of positive charges, called holes. Transistors exist in two species (or polarities) namely "PNP" in which two regions of P material (forming collector and emitter electrodes) are separated by a region of N material (forming the base electrode) and "NPN" in which N material collector and emitter electrodes are separated by a P material base electrode. In either case (PNP or NPN) the juxtapositioning of electrode regions of opposite semiconductor materials gives rise to a capacitive region at their interface (or junction) called a depletion region. The characteristics of such junctions (and hence their capacities) vary as a function of the potentials between electrodes and the level of current being conducted. A transistor, therefore, has interelectrode capacities which vary as a function of conduction.

The oscillator of the present invention uses the capacities of transistors 20 and 30 to resonate the combination of inductor 13 and capacitors 14 and 15 at the desired frequency. Each change of oscillator current produces a corresponding change in capacitances 20', 30' and 20'' which, in turn, alters or shifts the resonant frequency of load impedance 18, causing a corresponding change in oscillation frequency. As a result, the frequency of the differential output signals developed across resistors 11 and 12 is controlled by the conduction of oscillator transistors 20 and 30. The frequency variation of the oscillator is accomplished by changing the relative conduction levels of series and shunt transistors 50 and 60 without the use of any additional external resonant circuit elements or interconnecting terminals.

The lower frequency limit of oscillator 9 is determined on one side by the cutoff point of series transistor 50 (frequency determined by the level of conduction in constant current source transistor 40). The upper frequency limit is determined when shunt transistor 60 is in saturation (frequency determined by the conduction level of constant current source 70). Both "limit" frequencies are separately adjustable yielding a high degree of design flexibility.

FIG. 3 shows the DC equivalent of the oscillator system of FIG. 1. Because inductor 13 has near zero resistance, the collectors of transistors 20 and 30 are shown connected together. The parallel combination of resistors 11 and 12 may be represented by an equivalent resistor 16. Since the oscillator transistors, collectors and bases are cross connected, the transistors act as a pair of parallel diodes connected to constant current source transistor 40. The DC equivalent of series and shunt transistors 50 and 60 and constant current source transistor 70 remains the same as the actual circuit of FIG. 1. The load current $I_1$ flowing through resistor 16 divides at junction 27 into current $I_2$, flowing through shunt transistor 60, and currents $I_3$ and $I_4$ flowing through oscillator transistors 20 and 30. Currents $I_3$ and $I_4$ combine at the junction of the oscillator transistor emitters to form current $I_5$ which has a component $I_6$ flowing through series transistor 50 and a constant component $I_7$ flowing through constant current transistor 40. Since $I_7$ is constant, changes in the conduction of oscillator transistors 20 and 30, caused by the applied control signal, produce direct changes in currrent $I_6$.

Constant current source transistor 70, maintains the sum of currents $I_6$ and $I_2$ flowing through transistors 50 and 60, respectively, equal to its constant current $I_8$. Transistor 70, therefore, functions as a balance means for causing control signal-induced-changes in $I_6$ to appear as equal and opposite changes in $I_2$. Current $I_1$, which determines the DC potential of the output signals is equal to the sum of currents $I_7$ and $I_8$, both of which are constant. Therefore, while the current ($I_2$) shunted around oscillator transistors 20 and 30 and the currents ($I_3$ and $I_4$) flowing through them vary in response to the applied control signal, current $I_1$ (total load current) remains constant, resulting in a constant DC output voltage.

It should also be noted that since the total current flowing through equivalent resistor 16 is equal to the sum of currents through constant current source transistors 40 and 70, variations of operating potential (+V) do not affect the oscillator current. Therefore, no change in frequency of oscillation results from such variations, greatly increasing the stability of any system.

The signal controlled oscillator system described produces balanced output signals, variable in frequency, and maintained at a constant DC potential. Because the DC potential is constant throughout the variations of applied control signal voltage, coupling to other stages within the integrated circuit is facilitated without the use of external coupling components which would require IC terminals.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A signal controllable variable frequency oscillation system, suitable for fabrication in an integrated circuit, producing oscillatory signals comprising:

an oscillator including a first amplifying device having a reactive impedance which varies as a function of said first amplifying device conduction level, said reactive impedance determining the frequency of said oscillatory signal;

a load impedance coupled to said first amplifying device;

means changing said first amplifying device conduction level in response to an applied control signal;

means maintaining the DC level of said oscillatory signals substantially constant despite changes in said conduction level including:

shunting means, coupled to said load impedance, providing a conductive path substantially paralleling said first amplifying device; and balance means causing the respective current changes in said first amplifying device and said shunting means produced by said control signal to vary oppositely.

2. An oscillation system as in claim 1, wherein said means changing said first amplifying device conduction level includes:

series means, coupled between said first amplifying device and said balance means, providing a conductive path substantially in series with said first amplifying device.

3. An oscillation system as in claim 2, wherein said shunting means includes a second amplifying device.

4. A signal controllable variable frequency oscillation system as in claim 3, wherein said load impedance includes a pair of matched resistors providing balanced outputs.

5. An oscillation system as in claim 4, wherein said series means includes:

a third amplifying device, said control signal being applied to said third amplifying device to vary its conduction level.

6. An oscillation system as in claim 5, wherein said balance means includes:

a constant current source formed by a fourth amplifying device having an output electrode coupled to said second and third amplifying devices and an input electrode maintained at a fixed potential.

7. An oscillation system as in claim 6, wherein said oscillator includes:

a differential amplifier including fifth and sixth amplifying devices, each having input, output and common electrodes, said common electrodes of said fifth and sixth amplifying devices being coupled together; and said input and output electrodes being cross coupled in a regenerative manner and wherein said load impedance further includes:

a low resistance inductive element interconnecting said output electrodes of said fifth and sixth amplifying devices;

said first and second resistive elements being coupled to said output electrodes of said fifth and sixth amplifying devices; and capacitive means resonating said inductive element.

8. An oscillation system as in claim 7, wherein said oscillator includes:

a current source including a seventh amplifying device having an output electrode coupled to said common electrodes of said fifth and sixth amplifying devices, and an input electrode maintained at a fixed potential.

\* \* \* \* \*